United States Patent [19]
DeMeester et al.

[11] Patent Number: 5,349,297
[45] Date of Patent: Sep. 20, 1994

[54] COMBINED SELF SHIELDED GRADIENT COIL AND SHIMSET

[75] Inventors: Gordon D. DeMeester, Wickliffe; Michael A. Morich, Mentor; William H. Amor, Chagrin Falls, all of Ohio

[73] Assignee: Picker International Inc., Highland Hts., Ohio

[21] Appl. No.: 80,566

[22] Filed: Jun. 21, 1993

Related U.S. Application Data

[63] Continuation-in-part of Ser. No. 942,521, Sep. 9, 1992, Pat. No. 5,296,810, and a continuation-in-part of Ser. No. 859,152, Mar. 27, 1992, Pat. No. 5,289,128, and a continuation-in-part of Ser. No. 859,154, Mar. 27, 1992, Pat. No. 5,280,247.

[51] Int. Cl.$^5$ ............................................. G01R 33/20
[52] U.S. Cl. ....................................... 324/318; 335/216
[58] Field of Search .................. 324/300, 307, 309, 318, 324/319, 320, 322; 335/216, 301

[56] References Cited

U.S. PATENT DOCUMENTS

| | | | |
|---|---|---|---|
| 4,587,504 | 5/1986 | Brown et al. | 335/216 |
| 4,703,275 | 10/1987 | Holland | 324/318 |
| 4,733,189 | 3/1988 | Punchard et al. | 324/318 |
| 4,737,716 | 4/1988 | Roemer et al. | 324/319 |
| 4,761,612 | 8/1988 | Holland et al. | 324/307 |
| 4,876,510 | 10/1989 | Siebold et al. | 324/318 |
| 4,881,035 | 11/1989 | Siebold | 324/320 |
| 4,978,920 | 12/1990 | Mansfield et al. | 324/318 |
| 5,280,247 | 1/1994 | DeMeester et al. | 324/318 |
| 5,289,128 | 2/1994 | DeMeester et al. | 324/318 |

FOREIGN PATENT DOCUMENTS 2180943A 9/1985 United Kingdom.

OTHER PUBLICATIONS

"Active Magnetic Screening of Gradient Coils in NMR Imaging", Mansfield, et al., Journal of Magnetic Resonance, 66, 573-576 (1986) (no month).

"Active Magnetic Screening of Coils for Static and Time-Dependent Magnetic Field Generation in NMR Imaging", Mansfield, et al., J. Phys. E. Sci. Instrum. 19, 540-544 (1986) (no month).

*Primary Examiner*—Michael J. Tokar
*Attorney, Agent, or Firm*—Fay, Sharpe, Beall, Fagan, Minnich & McKee

[57] ABSTRACT

The magnetic field assembly of a magnetic resonance imaging device includes an annular superconducting magnet (10) which is mounted within a toroidal vacuum vessel (24). A cylindrical member (26) defines a central bore (12) through which the superconducting magnets generate a uniform, static magnetic field. A cylindrical, dielectric former (46) is mounted in the bore displaced by an annular gap (58) from the cylindrical member. A shimset (60) for shimming the uniformity of the magnetic field is mounted in the gap (58). A radio frequency coil (32) is mounted within the cylindrical member defining a patient receiving examination region. An RF shield (34) is mounted around the exterior peripheral surface of the former. Primary gradient coils (50, 52, 54) are mounted around and potted to the exterior of the dielectric former around the RF shield. Gradient shield or secondary coils (74, 76, 78) are potted around an exterior of the cylindrical member within the vacuum chamber.

14 Claims, 3 Drawing Sheets

COMBINED SELF SHIELDED GRADIENT COIL AND SHIMSET

The present application is a continuation-in-part of U.S. applications Ser. Nos. 07/942,521, filed Sep. 9, 1992, now Pat. No. 5,296,810; 07/859,152, filed Mar. 27, 1992, now Pat. No. 5,289,128; and 07/859,154, filed Mar. 27, 1992 now Pat. No. 5,280,247.

BACKGROUND OF THE INVENTION

The present invention relates to the magnetic resonance art. It finds particular application in conjunction with self shielded gradient coil assemblies for magnetic resonance imaging apparatus and will be described with particular reference thereto. However, it will be appreciated that the present invention will also find application in conjunction with magnetic resonance spectroscopy systems and other applications which require RF fields and gradient magnetic fields.

Heretofore, magnetic resonance imagers have included a superconducting magnet which generated a temporally constant primary magnetic field. The superconducting magnet was encased in a toroidal vacuum vessel or dewar that included a central cylindrical bore through which the primary magnetic field was generated. As generated, the primary magnetic field commonly had limited non-uniformities. Active or passive shims were mounted to the inside surface of the cylindrical bore to correct the non-uniformities and render the primary magnetic field substantially uniform within the bore. Although active shims in the form of resistive coils were sometimes used, passive shims in the form of small pieces of steel about an inch square and 0.010 inches thick were more common.

There are several important subsystems of the MRI system that are placed within the cylindrical bore of the primary magnet. Usually the structure closest to the bore is a shimset. The shimset may consist of coils carrying a specified amount of current or ferromagnetic material placed so as to reduce the non-uniformity of the primary magnetic field. The next inward structure is a set of coils for generating the x, y, and z-gradient fields used for MRI. Within the gradient coil structure is the RF coil and the object to be imaged. One alternative to this arrangement has been to place superconducting shim coils within the cold region of the magnet. This placement of shimset serves to separate the shims as far as possible from the imaging volume which is desirable when removing low order field inhomogeneity.

One of the difficulties was that the gradient magnetic fields generated for the MRI also induced eddy currents in the magnet structures. These eddy currents in turn produced their own magnetic fields thus interfering with the imaging process. The induced eddy currents can be compensated for with pre-emphasis only to the extent that the pre-emphasis perfectly mimic the gradient fields. Since there are some very cold conductive surfaces within the crystal to minimize helium boil-off, eddy currents could persist for seconds. Separation between the gradient coils and the magnet structure reduced the contribution of eddy currents and allowed plenty of space for a shimset.

More recently, self shielded gradients have been developed so as to eliminate eddy currents. A self shielded gradient consists of a set of primary x, y, and z coils and an additional set of x, y, and z-coils at a larger radius. The geometry of the coils is chosen such that when the coils are excited in series, they have substantially no residual gradient field outside of the outer coils. Within the inner radius, the combination of coils produces a substantially linear gradient. A larger separation between the inner and outer coils of a shielded gradient results in more efficient gradient field generation.

The cost of a large bore superconducting magnet is generally more than a smaller magnet. Thus, reduced system cost as well dictates minimum spacing between the gradient shield coil and the magnet bore.

The present invention provides a new and improved self shielded gradient coil design which overcomes the above-referenced problems and others.

SUMMARY OF THE INVENTION

In accordance with the present invention, a toroidal superconducting magnet assembly generates a temporally constant primary magnetic field through an examination region. The superconducting magnet assembly includes a generally cylindrical member which defines a longitudinally extending bore which extends around the examination region. A gradient coil means causes magnetic field gradients within the bore. The gradient coil assembly consists of a first cylindrical dielectric former supporting a primary set of x, y, and z-gradient field coils and a second cylindrical dielectric former supporting a second set of shielding x, y, and z-coils. A shimming means for adjusting the uniformity of the primary or temporally constant magnetic field within the examination region is located between the two formers of the gradient coil assembly. A radio frequency coil is disposed within the bore of the gradient coil assembly for transmitting the radio frequency waveforms into the examination region. A sequence control means controls the gradient coil means and the radio frequency coil assembly.

In accordance with a still more limited aspect of the present invention, the shimming means includes a plurality of elongated dielectric members within which a plurality of ferrous shim elements are mounted. The elongated dielectric members are mounted to an interior surface of the cylindrical member extending parallel to the bore.

In accordance with more limited aspect of the present invention, a magnetic resonance imaging apparatus is provided. A superconducting magnet assembly generates a temporally constant magnetic field along the z or longitudinally through a bore which surrounds an examination region. A generally toroidal vacuum chamber or cryostat includes a cylindrical member which defines a bore which extends around the examination region therethrough. An annular superconducting magnet is disposed within the cryostat for generating the main magnetic field longitudinally through the bore and the examination region. A helium vessel disposed within the toroidal vacuum vessel surrounds the annular superconducting magnet for maintaining it chilled to a temperature near 4° K. at which it is superconducting. A self shielded gradient coil assembly causes z oriented magnetic fields with gradients within the bore along a first, second, and third mutually orthogonal axes. The structure supporting the gradient coils consists of a means for supporting a primary x-gradient coil set and at a larger radius, a means for supporting a shielding x-gradient coil set. The self shielded y and z-gradient coil sets are analogous to the x-gradient coil set. The x and y-gradient coils and usually the z-gradient coils are mounted on cylindrical formers for support. A plurality of primary gradient coils are wrapped around the former for generating magnetic field gradients within the bore along the first, second, and third axes. Secondary gradient coils are wrapped around an outer diameter of the cylindrical member within the vacuum vessel. The primary and secondary coils are series connected to cause opposing gradient fields. The opposing fields induce gradients along the first, second, and third axes within the examination region and shield at least selected regions outside the bore from magnetic field gradients. A shim means for shimming the main magnetic field within the bore is mounted in the annular gap between the formers of the self shielded gradient coil. A radio frequency coil assembly is disposed within the bore for transmitting radio frequency pulses into the examination region for inducing and manipulating magnetic resonance of selected dipoles within the examination region. A sequence control means controls the gradient coil assembly and the radio frequency coil assembly for generating magnetic resonance imaging gradient and RF pulse sequences. An image reconstruction means reconstructs image representations from magnetic resonance signals emanating from the examination region.

One advantage of the present invention is that it improves the efficiency of the shimset in correcting various orders of magnetic field inhomogeneities.

Another advantage of the present invention is that it maximizes the internal usable bore of an MRI magnet while minimizing the inner diameter of the superconducting magnet.

Another advantage of the present invention resides in the simplicity of manufacture.

Another advantage of the present invention is that the shimset is integrated into a self shielded gradient coil.

Still further advantages of the present invention will become apparent to those of ordinary skill in the art upon reading and understanding the following detailed description of the preferred embodiments.

BRIEF DESCRIPTION OF THE DRAWINGS

The invention may take form in various components and arrangements of components, and in various steps and arrangements of steps. The drawings are only for purposes of illustrating a preferred embodiment and are not to be construed as limiting the invention.

DETAILED DESCRIPTION OF THE PREFERRED EMBODIMENTS

Figure 1:
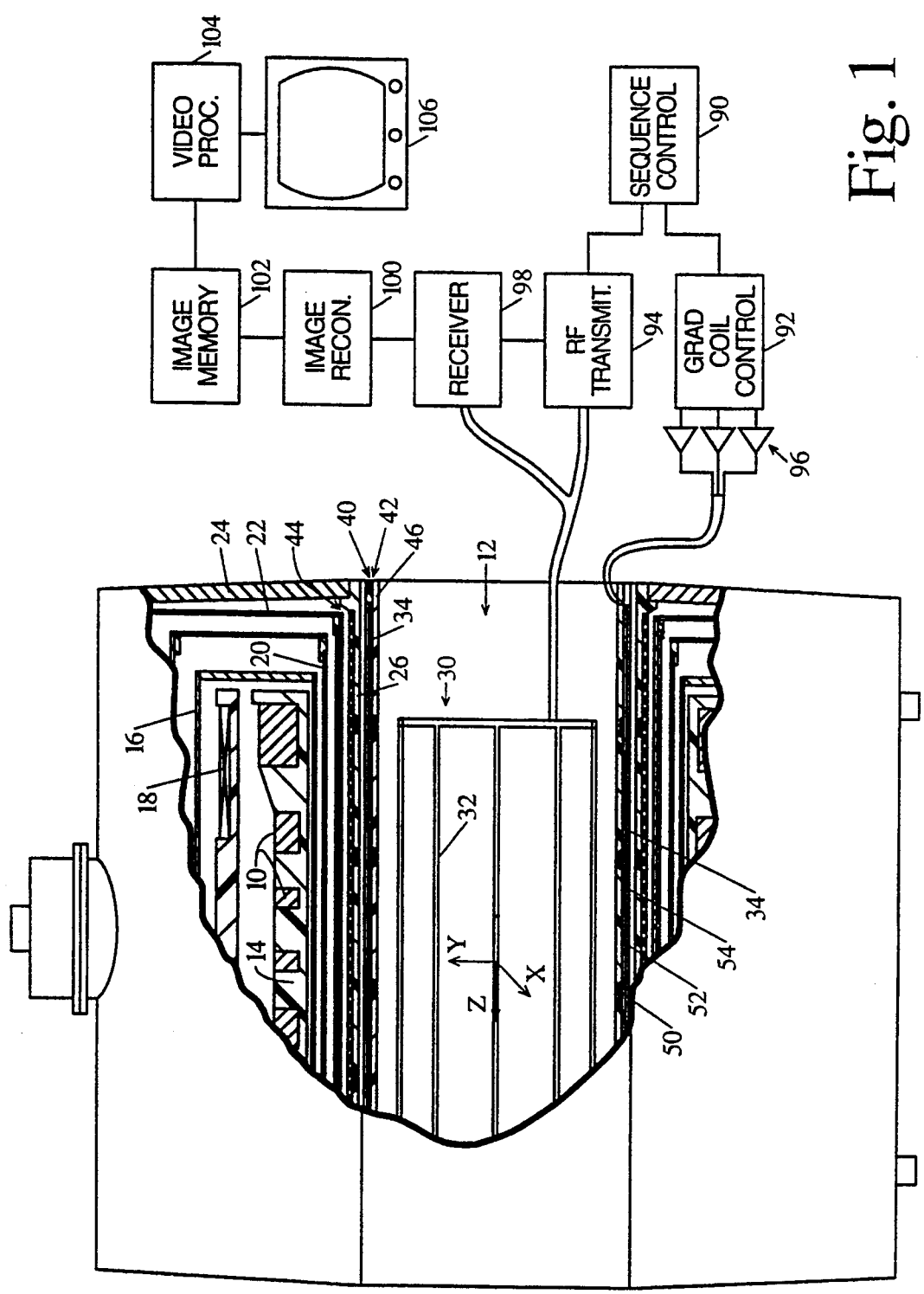
FIG. 1 is a diagrammatic illustration of a magnetic resonance imaging system in accordance with the present invention.

With reference to FIG. 1, a plurality of superconducting magnetic field coils 10 generate a temporally constant magnetic field along a longitudinal or z-axis of a central bore 12. The x and y- axes are defined orthogonal to the z-axis and each other, e.g. horizontally and vertically. Coils of the superconducting magnet are supported by a former 14 and received in a toroidal helium vessel or can 16. The helium vessel is filled with liquid helium to maintain the superconducting magnet at a temperature at which it is superconducting. A main magnetic field shield coil assembly 18 generates a magnetic field which opposes the field generated by the superconducting magnet 10 in regions surrounding the superconducting magnet.

To reduce helium boil-off, the toroidal helium vessel 16 is surrounded by a first cold shield 20 which is maintained at about 20°K. or less. A second cold shield assembly 22 is chilled to about 60°–70° K. or less. The first and second cold shields are preferably cooled by mechanical refrigeration (not shown). A toroidal vacuum vessel 24 encases the cold shields to define a vacuum reservoir therearound. The vacuum vessel 24 includes a cylindrical member 26 that defines the bore 12 and extends parallel to the z-axis. The main magnetic field is generated through the cylindrical member 26. Preferably, layers of aluminized mylar insulation are arranged between the vacuum vessel and the cold shields.

Figure 2:
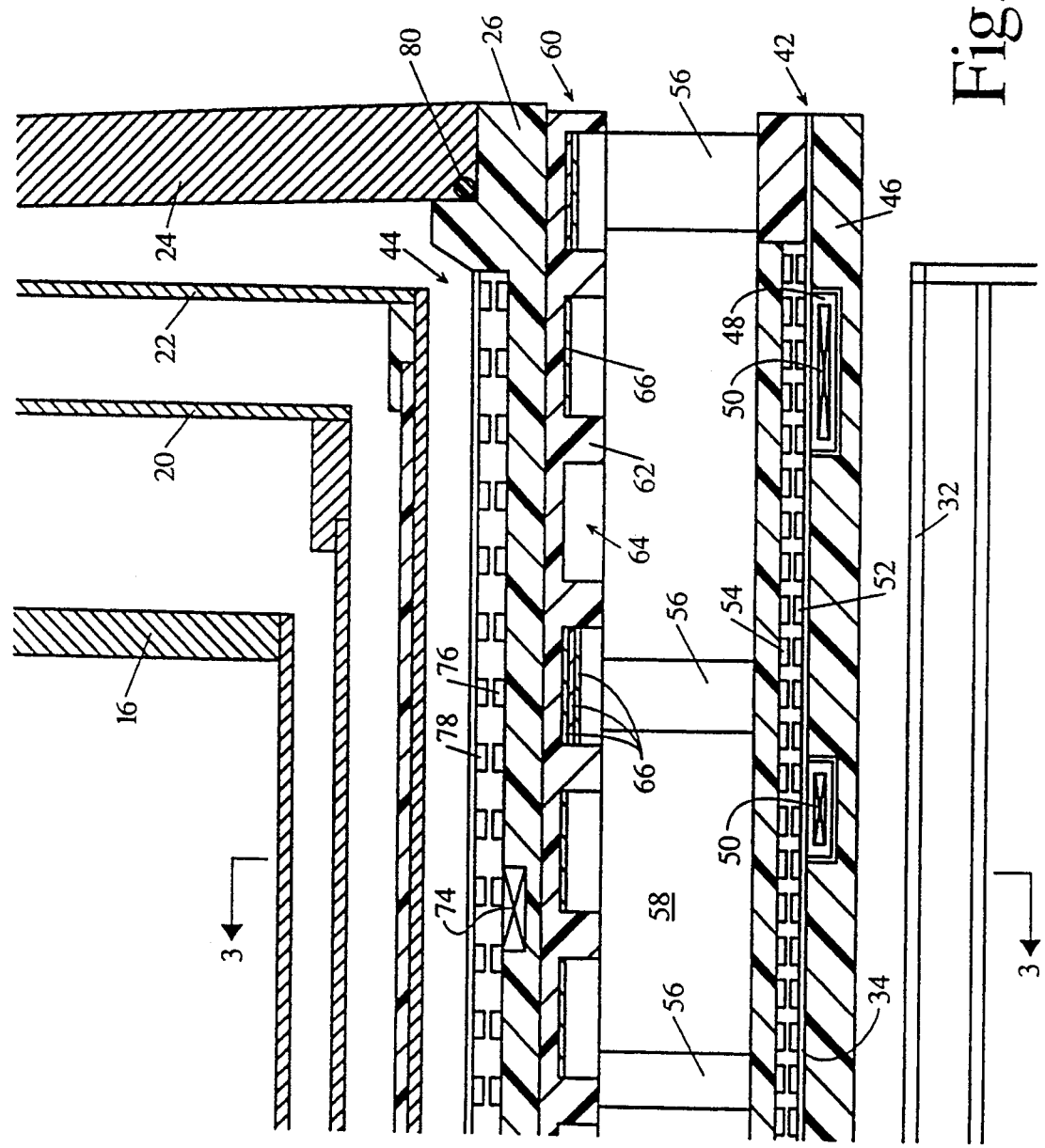
FIG. 2 is an enlarged, detailed cross-sectional view illustrating the relationship of the RF primary and shield coils, the gradient primary and shield coil, and the superconducting magnet vacuum vessel and cold shields.
Figure 3:
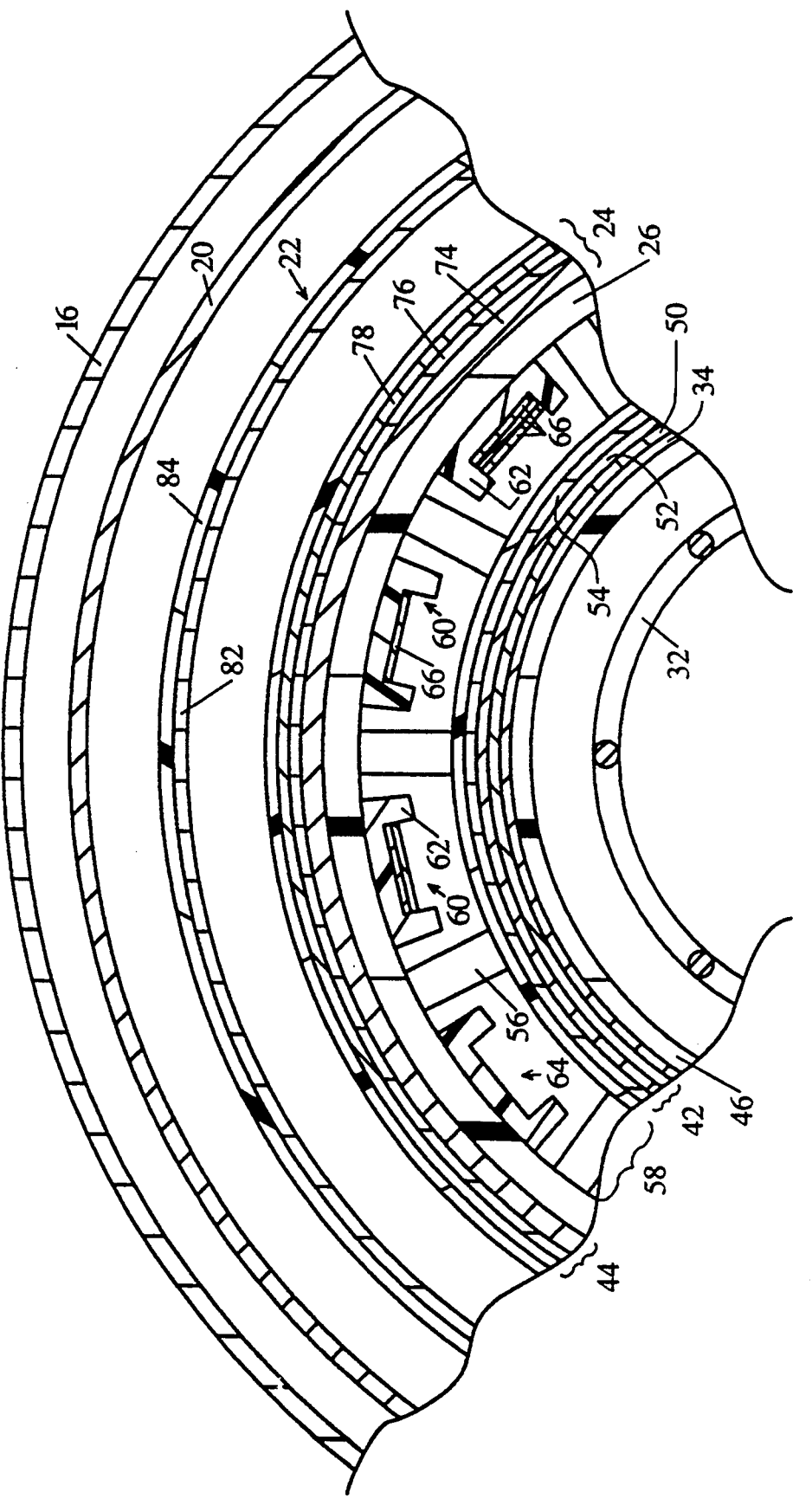
FIG. 3 is a sectional view through section 3—3 of FIG. 2.

With continuing reference to FIG. 1 and further reference to FIGS. 2 and 3, an RF coil assembly 30 is mounted in the bore 12. More specifically, the RF coil assembly includes a primary RF coil 32 and an RF shield 34. The primary RF coil 32, preferably a quadrature or birdcage type coil, has an inner diameter which defines a patient receiving bore, preferably of at least 55 cm.

A gradient coil assembly 40 includes a primary whole body gradient coil assembly 42 and a secondary coil assembly 44. The primary gradient coil assembly 42 includes a cylindrical dielectric former 46. Preferably, the former has a sufficient thickness to maintain its structural integrity under the forces associated with generating the magnetic field gradients, e.g. 5–10 mm of glass reinforced plastic, preferably about 7.5 mm. The former 46 has a series of grooves 48 defined or cut in its outer surface in accordance with the pattern cf a z-gradient coil 50.

The RF shield 34, preferably a fine copper mesh, is applied to the outer surface of the former 46 and through the z-coil receiving grooves 48. The RF shield mesh may be deformed into the grooves by tightly wound z-gradient wire windings, may be fitted into the grooves, may have solder connected segments extending through the grooves, or the like. The grooves 48 have a depth which generally corresponds to the thickness of the z-gradient coils such that after the z-gradient coils are inserted, a substantially circularly cylindrical surface is presented for receiving x and y-gradient coils 54, 52. The x and y-gradient coils 54, 52 are preferably fingerprint type coils as illustrated in greater detail in U.S. patent application Ser. No. 07/942,521. Due to the circular symmetry, the x and y-gradient coils are substantially identical, but offset 90° relative to each other and scaled to a corresponding radius. The x and y-gradient coils, the RF shield, and the z-gradient coils are potted in an epoxy or other dielectric material. The woven screen RF shield and the fingerprint type coils are advantageous in the potting process because they provide paths for the potting material flow.

Various alternate constructions are also contemplated. First, grooves need not be provided for the z-gradient coil. Rather, the z-gradient coil 50 may be laminated in a layer on top of the RF shield 34. Second, if grooves 48 are provided for the z-gradient coil, strips of foil or other RF shield material may be laid in the grooves and a continuous sheet or strips of the RF mesh or other RF shield may be wound over the z-coil. Solder connections or the like provide electrical continuity between the strips inserted under the z-gradient coil and the remainder of the RF shield. Third, the z-gradient coil may be individual windings, a cluster or bunched coil, or a distributed coil. Fourth, by winding the z-gradient coil under tension, the RF shield screen can be deformed into the grooves eliminating the soldering.

Other RF shields 34 are also contemplated, such as a thin electrically conductive layer that is electro-deposited or sputtered. The RF screen may also include lapped segments of mesh or copper film. The RF screen may also be mounted on the outer or inner surface of the cylindrical former 46.

A plurality of plastic I-beams or other mechanical structures 56 are mounted between the gradient former 46 and the cylindrical member 26. The I-beams or other mechanical supports 56 define gaps or passages 58 of sufficient size to receive lower order magnet field shimsets 60. The shimsets each include a longitudinally elongated dielectric former 62 that defines a plurality of pockets 64 for receiving ferrous elements 66. The ferrous elements are preferably thin sheets of steel which are held in the pockets by clips or other mechanical attachment means.

The secondary gradient coil 44 includes the cylindrical dielectric member or former 26 which preferably has grooves for receiving a z-gradient shield coil 74. X and y-gradient shield or secondary coils 76, 78 are mounted on the outer circular periphery of the former 26 and potted in epoxy.

The design of the x, y, and z-gradient and gradient shield coils is preferably of the design shown in the above-referenced U.S. patent application Ser. No. 07/942,521. The primary and secondary gradient coils are series connected to create accurate gradient magnetic fields in the bore 12 and cancelling magnetic fields outside the bore, particularly in the vacuum vessel. Preferably, an annulus of more than 33 mm is provided between the primary gradient coil former 46 and the cylindrical member 26. This provides passages for air cooling, displaces the primary and shield gradient coils a maximal amount, and provides a compartment within which to insert magnetic field shims for shimming the uniformity of the main magnetic field. Preferably, the cylindrical member 26 is connected with other portions of the vacuum vessel 24 with an O-ring joint 80 to maintain the vacuum while providing a solid construction which maximizes the space available for cold shield assemblies therein.

Various alternate embodiments are also contemplated. First, the primary z-gradient coil 50 may be a distributed coil defined by copper or other electrically conductive tubes. By running a cooling fluid through the tubes, greater cooling efficiency is achieved and higher power levels or gradient strengths can be run.

Preferably, the cold shield 22 includes a slotted tube cylindrical cold shield portion 82 which is mounted on a cylindrical dielectric former 84.

A sequence control means 90 controls a gradient coil control means 92 and a transmitter 94. The gradient coil control 92 is connected with a series of current pulse generators 96 which, in turn, are connected with the primary gradient coils 50, 52, 54. Optionally, the secondary gradient coils can be controlled independently and directly by the gradient control means 92 rather than being series connected with the primary gradient coil. The transmitter 94, preferably a digital transmitter, is connected with the primary radio frequency coil for generating pulses of radio frequency signals for exciting and manipulating magnetic resonance in selected dipoles of a portion of a subject within the bore. A radio frequency receiver 98, preferably a digital receiver, is connected with the radio frequency primary coil or surface coils (not shown) for demodulating magnetic resonance signals emanating from the examined portion of the subject. An image reconstruction means 100, such as an inverse two-dimensional Fourier transform reconstruction means, reconstructs the received magnetic resonance signals into an electronic image representation that is stored in an image memory 102. A video processor 104 converts electronic images stored in the memory 102 into appropriate format for display on a video monitor 106.

The invention has been described with reference to the preferred embodiments. Obviously, modifications and alterations will occur to others upon reading and understanding the preceding detailed description. It is intended that the invention be construed as including all such modifications and alterations insofar as they come within the scope of the appended claims or the equivalents thereof.

Having thus described the preferred embodiment, the invention is now claimed to be:

1. A magnetic resonance imaging apparatus comprising:
   a superconducting magnet assembly for generating a temporally constant primary magnetic field through an examination region, the superconducting magnet assembly including:
      a generally toroidal vacuum chamber including a cylindrical member which defines a bore therethrough, the bore extending around the examination region,
      an annular superconducting magnet disposed within the toroidal vacuum chamber for generating the primary magnetic field longitudinally through the bore and the examination region,
      a helium vessel disposed within the toroidal vacuum vessel and surrounding the annular superconducting magnet for maintaining the superconducting magnet chilled to a temperature at which it is superconducting;
   a self shielded gradient coil assembly for causing magnetic field gradients within the bore along first, second, and third mutually orthogonal axes, the gradient coil assembly including:
      a cylindrical, dielectric former which is smaller in diameter than the cylindrical member,
      primary gradient coils wrapped around the former,
      secondary gradient coils supported by the cylindrical member, the primary and secondary gradient coils being coupled to cause the magnetic field gradients along the first, second, and third axes within the examination region and shield at least selected regions outside of the bore from magnetic field gradients,
      a mounting means for mounting the former within the bore displaced from the vacuum vessel cylindrical member, such that an annular gap is defined between the primary gradient coils and the secondary gradient coils;
   a shim means mounted in the annular gap between the primary and secondary gradient coils for shimming magnetic fields within the bore;
   a radio frequency coil assembly disposed within the bore for transmitting radio frequency pulses into the examination region for inducing and manipulating magnetic resonance of selected dipoles within the examination region;

a sequence control means for controlling the gradient coil assembly and the radio frequency coil assembly for generating magnetic resonance imaging gradient and RF pulse sequences;

an image reconstruction means for reconstructing image representations from magnetic resonance signals emanating from the examination region.

2. The magnetic resonance imaging apparatus as set forth in claim 1 wherein the shimming means includes a plurality of ferrous elements and an attaching means for selectively attaching the ferrous elements to the cylindrical member.

3. The magnetic resonance imaging apparatus as set forth in claim 2 wherein the attaching means includes an elongated non-ferrous member which extends longitudinally through the annular gap, the dielectric member having pockets for holding the ferrous elements.

4. The magnetic resonance imaging apparatus as set forth in claim 1 wherein the radio frequency coil assembly includes a primary radio frequency coil disposed within the former and a radio frequency shield disposed substantially along the outer surface of the former.

5. The magnetic resonance imaging apparatus as set forth in claim 4 wherein the radio frequency shield includes a fine metal mesh layer.

6. A magnetic resonance apparatus comprising:

a magnet assembly for generating a temporally constant magnetic field along a longitudinal axis through an examination region, the magnet assembly including a generally cylindrical member which defines a longitudinally extending bore which extends around the examination region;

a gradient coil means for causing magnetic field gradients within the bore, the gradient coil means including:
a shield gradient coil assembly supported by the cylindrical member,
a primary gradient coil assembly supported within the first gradient coil assembly;

a shimming means supported between the primary gradient coil assembly and the cylindrical member for adjusting the magnetic field through the examination region;

a radio frequency coil assembly disposed within the bore for transmitting radio frequency pulses into the examination region;

a sequence control means for controlling the gradient coil means and the radio frequency coil assembly.

7. The magnetic resonance apparatus as set forth in claim 6 wherein the shimming means includes a plurality of ferrous elements and an attaching means for selectively attaching the ferrous elements to an interior surface of the cylindrical member.

8. The magnetic resonance imaging apparatus as set forth in claim 7 wherein the attaching means includes an elongated non-ferrous member which extends longitudinally through the annular gap, the non-ferrous member having pockets for holding the ferrous elements.

9. The magnetic resonance apparatus as set forth in claim 6 wherein the shield gradient coil assembly is mounted on an outer peripheral surface of the cylindrical member and the primary gradient coil assembly is mounted inside and displaced from the cylindrical member whereby the shimming means is disposed between the shield and primary coil assemblies.

10. The magnetic resonance apparatus as set forth in claim 9 wherein the RF coil assembly includes a primary radio frequency coil disposed within the primary gradient coil assembly and a radio frequency shield disposed between the primary radio frequency coil and the primary gradient coil assembly.

11. The magnetic resonance apparatus as set forth in claim 6 wherein the shield and primary gradient coil assemblies are connected in series.

12. The magnetic resonance apparatus as set forth in claim 6 wherein the shield and primary gradient coil are actively driven independent from each other.

13. The magnetic resonance apparatus as set forth in claim 6 wherein the primary gradient coil assembly includes a cylindrical former on which a plurality of primary gradient coils are supported.

14. The magnetic resonance apparatus as set forth in claim 13 further including an RF shield mounted between the former and the gradient coils.

* * * * *